(12) United States Patent
Blosse

(10) Patent No.: US 7,151,048 B1
(45) Date of Patent: Dec. 19, 2006

(54) POLY/SILICIDE STACK AND METHOD OF FORMING THE SAME

(75) Inventor: Alain Blosse, Belmont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 556 days.

(21) Appl. No.: 10/097,674

(22) Filed: Mar. 14, 2002

(51) Int. Cl.
*H01L 21/3205* (2006.01)

(52) U.S. Cl. ............ 438/592; 438/585; 438/296; 438/303; 438/305; 257/368; 257/413

(58) Field of Classification Search ........ 257/315, 257/316, 368, 369, 319, 320, 321, 322
See application file for complete search history.

(56) References Cited

U.S. PATENT DOCUMENTS

| | | | | |
|---|---|---|---|---|
| 5,385,866 A | * | 1/1995 | Bartush | 438/595 |
| 5,393,685 A | | 2/1995 | Yoo et al. | 437/44 |
| 5,756,392 A | | 5/1998 | Lu et al. | 438/592 |
| 5,877,074 A | | 3/1999 | Jeng et al. | 438/592 |
| 6,127,227 A | * | 10/2000 | Lin et al. | 438/261 |
| 6,165,884 A | | 12/2000 | Lee et al. | 438/592 |
| 6,177,334 B1 | | 1/2001 | Chen et al. | 438/584 |
| 6,287,913 B1 | * | 9/2001 | Agnello et al. | 438/241 |
| 6,420,250 B1 | | 7/2002 | Cho et al. | |
| 6,429,496 B1 | * | 8/2002 | Li et al. | 257/411 |
| 6,465,370 B1 | * | 10/2002 | Schrems et al. | 438/783 |
| 6,465,837 B1 | * | 10/2002 | Wu | 257/315 |
| 6,800,543 B1 | | 10/2004 | Taguwa | |
| 6,833,310 B1 | | 12/2004 | Kim et al. | |
| 2001/0010975 A1 | | 8/2001 | Tanabe et al. | |
| 2001/0031535 A1 | * | 10/2001 | Agnello et al. | 438/275 |
| 2002/0042180 A1 | | 4/2002 | Tuan et al. | |
| 2002/0058410 A1 | * | 5/2002 | Sung et al. | 438/649 |
| 2003/0170942 A1 | | 9/2003 | Taguwa | |

FOREIGN PATENT DOCUMENTS

EP  0 327 210  1/1989

OTHER PUBLICATIONS

Kim, Hyeon-Soo, Sang-Moo Lee, In-Seok Yeo, Sang-Do Lee, and Seung-Ho Pyi, Mar./Apr. 2001. "Sidewall oxidation behavior of dichlorosilane-based W-polycide gate", *J. Vac. Sci. Technol. B*, 19(2) pp. 361-365.

(Continued)

*Primary Examiner*—Nathan J. Flynn
*Assistant Examiner*—Fazli Erdem
(74) *Attorney, Agent, or Firm*—Evan Law Group LLC

(57) ABSTRACT

A method of forming a semiconductor structure comprises forming sidewall oxide on a stack, by rapid thermal oxidation. The stack is on a substrate and comprises (i) a first layer comprising silicon, (ii) a second layer, comprising silicon and tungsten, on the first layer, and (iii) a capping layer, on the second layer. The sidewall oxide in contact with the second layer is at most 50% thicker than the sidewall oxide in contact with the first layer.

18 Claims, 2 Drawing Sheets

OTHER PUBLICATIONS

Blosse, A.P., Spring 1998. "Improved Thermal Stability of CVD $WSi_x$ During Furnace Oxidation by a Rapid Thermal Anneal Pretreatment", published as "Rapid Thermal and Integrated Processing VII", *Semiconductors Electronic Materials and Processing*, vol. 525.

Hyeon-Soo Kim et al, "Sidewall Oxidation Behavior Of Dichlorosilane-Based W-Polycide Gate", J.Vac. Sci. Technol. B 19(2), Mar./Apr. 2001.

Diaz, C.H., et al., "An experimentally validated analytical model for gate line-edge roughness (LER) effects on technology scaling"., IEEE Electron Device Letters, vol. 22, No. 6, pp. 287-289, (2001).

Encyclopedia of Chemical Technology, Kirk-Othmer, vol. 14, pp. 677-709, (1995).

\* cited by examiner

POLY/SILICIDE STACK AND METHOD OF FORMING THE SAME

BACKGROUND

The present invention relates to semiconductor structures containing poly/silicide stacks.

Gates and interconnects of semiconductor structures may be conveniently made from doped polycrystalline silicon (poly). However, as the size of these structures continues to decrease, the resistivity of the poly becomes significant. Including a more conductive material, atop the poly, such as a metal silicide, mitigates this problem. These multilayer structures are often referred to as stacks.

During patterning of the stacks, it is desirable to restore the quality of the thin oxide layer near the foot of the stack and round the corner. In the case of a gate, this oxide is often referred to as the gate oxide. When the gate is made of only poly, a thin thermally grown oxide, on the sides of the gate, serves this purpose. In the case of a stack, simple thermal oxidation can lead to abnormal oxidation and defects that may interfere with subsequent processing of the semiconductor structure, such as "glob" formation at the poly/silicide interface (see, for example, "Improved Thermal Stability of CVD $WSi_x$ During Furnace Oxidation by a Rapid Thermal Anneal Pretreatment", Blosse, Alain P., Presentation to MRS conference, 1998; and "Sidewall oxidation behavior of dichlorosilane-based W-polycide gate", Kim, Hyeon-Soo et al., J. Vac. Sci. Technol. B 19(2), Mar/April 2001).

FIGS. 1 and 2 illustrate steps used in forming a poly/tungsten silicide gate stack. On a silicon substrate 2 having a thin oxide or oxynitride layer 10, is formed a poly layer 4 with or without a tungsten nitride barrier, then a tungsten silicide layer 6 and a silicon nitride capping layer 8; these layers are patterned to form a gate, as illustrated in FIG. 1. This structure is typically then subjected to rapid thermal annealing (RTA) at 800° C. for 30 seconds in a nitrogen or argon atmosphere (converting the phase structure of the tungsten silicide to a tetragonal phase, and transforming the barrier layer of tungsten nitride, if present, into tungsten silicide nitride), followed by oxidation (wet or dry) at 850–900° C. for about 30 minutes to 1 hour, to form sidewall oxide 12, as shown in FIG. 2.

Further processing allows for making semiconductor devices: doping of the substrate using the gate stack as a mask may be used to form lightly doped regions; applying an insulating layer, followed by etching, may be used to form spacers on the gate stack; heavy doping of the substrate using the gate stack and spacers as a mask may then be used to form source/drain regions; and further formation of oxide layers, vias, contacts and metallization, may be used to complete device formation. These types of processes are described in, for example, U.S. Pat. No. 5,756,392.

The process outlined in FIGS. 1 and 2 produces sidewall oxide that is at least two times thicker, adjacent the tungsten silicide, than adjacent the poly, causing an irregular gate profile. Shadowing during subsequent implantations, and altered spacer shape, both resulting from this irregular gate profile, can lead to degraded transistors formed from this semiconductor structure.

SUMMARY

In a first aspect, the present invention is a method of forming a semiconductor structure, comprising forming sidewall oxide on a stack, by rapid thermal oxidiation. The stack is on a substrate, and the stack comprises (i) a first layer comprising silicon, (ii) a second layer, comprising silicon and tungsten, on the first layer, and (iii) a capping layer, on the second layer. The sidewall oxide in contact with the second layer is at most 50% thicker than the sidewall oxide in contact with the first layer.

In a second aspect, the present invention is a method of forming a semiconductor structure, comprising forming sidewall oxide on a stack, by rapid thermal oxidation. The stack is on a substrate, and the stack comprises (i) a first layer comprising silicon, (ii) a second layer, comprising silicon and tungsten, on the first layer, and (iii) a capping layer, comprising silicon nitride, oxide, oxynitride, or multiple layer of one or more of these, on the second layer.

In a third aspect, the present invention is a method of forming a semiconductor device for these semiconductor structures.

In a fourth aspect, the present invention is a method of forming an electronic device, comprising the semiconductor device.

In a fifth aspect, the present invention is a semiconductor structure, comprising (A) a semiconductor substrate, and (B) a stack, on the semiconductor substrate. The stack comprises (i) a first layer comprising silicon, (ii) a second layer, comprising silicon and tungsten, on the first layer, and (iii) a capping layer, comprising silicon nitride, oxide, oxynitride, or multiple layer of one or more of these, on the second layer. The sidewall oxide in contact with the second layer is at most 50% thicker than the sidewall oxide in contact with the first layer.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein.

DETAILED DESCRIPTION

The present invention includes a rapid thermal oxidation (RTO) to form sidewall oxide that has a more consistent thickness between the silicide portion and the poly portion. Devices formed from this structure avoid the problem of device degradation encountered with conventional oxidation.

Figure 1:
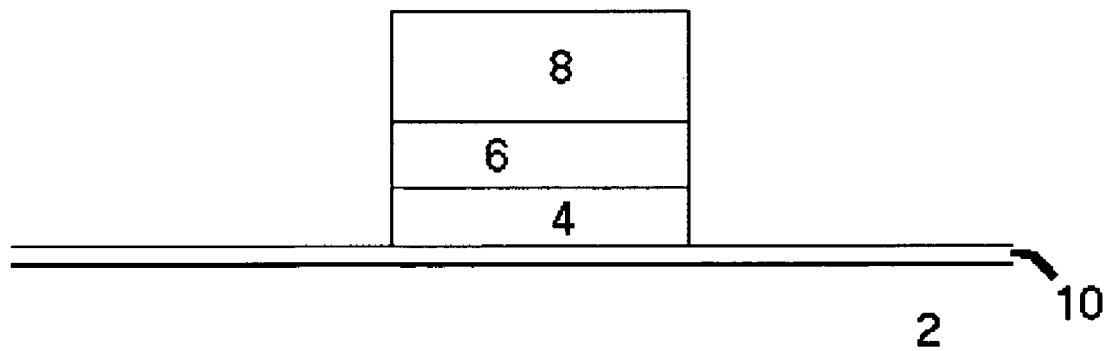
FIG. 1 shows a poly/tungsten silicide gate stack.
Figure 2:
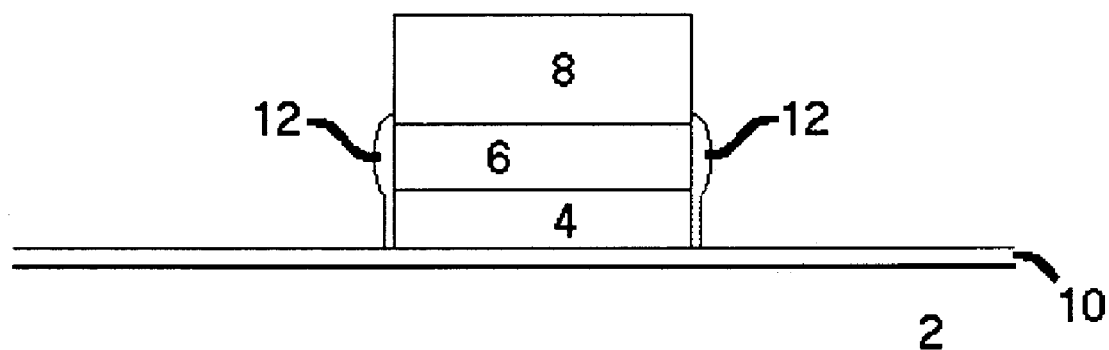
FIG. 2 show a poly/tungsten silicide gate stack with a sidewall oxide formed by conventional oxidation.
Figure 3:
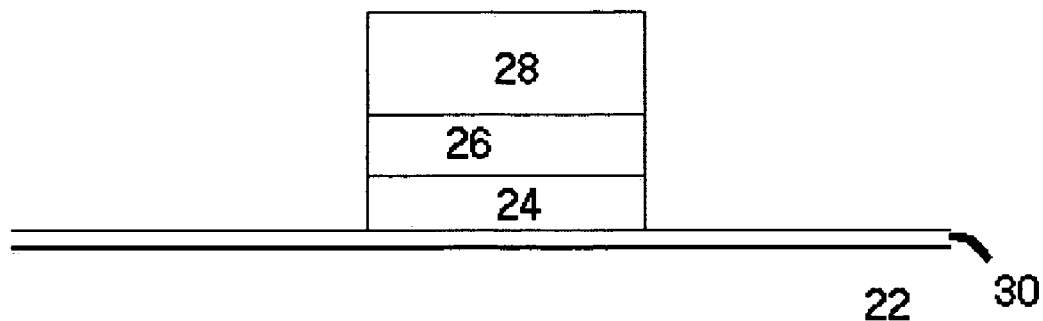
FIG. 3 shows a stack.
Figure 4:
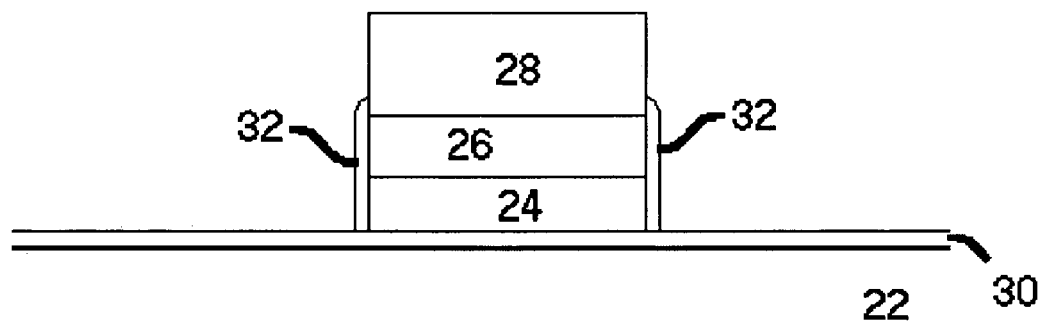
FIG. 4 shows a stack with sidewall oxide of the present invention.
Figure 5:
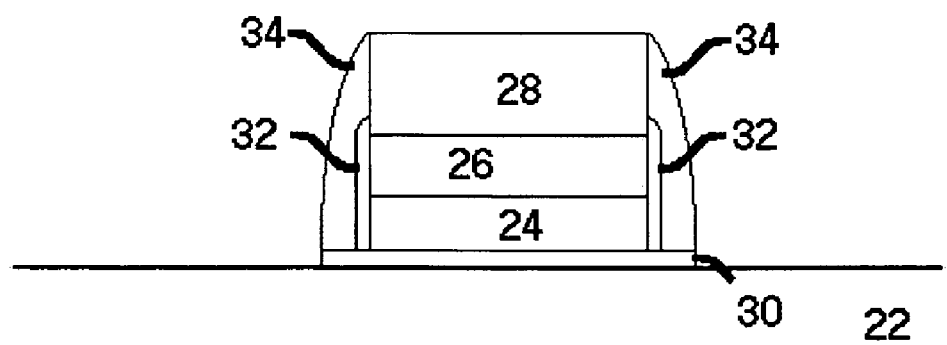
FIG. 5 shows a stack with sidewall oxide and spacers, of the present invention.

FIGS. 3–5 illustrate a process of the present invention. Onto a semiconductor substrate 22, having an insulating layer 30, is formed a silicon containing layer 24 preferably poly, a silicide layer 26, and a capping layer 28, which are then patterned, to form the structure shown in FIG. 3. Optionally, a barrier layer containing tungsten nitride may also be included on the poly.

Next, RTA of the structure converts the silicide layer from its as-deposited phase (typically a tetragonal phase or amorphous), to a hexagonal phase. This recrystallization using RTA is preferably carried out under an unreactive atmosphere, preferably containing nitrogen, a noble gas such as argon, or mixtures thereof. Preferably, the temperature is 720–1050° C., more preferably 750–950° C., most preferably 775–850° C. Preferably, the time of RTA is from 1 sec. to 10 min., more preferably 5–20 sec.

Sidewall oxide is then formed on the stack. The oxide is formed by RTO, preferably for a period of time and a temperature sufficient to form sidewall oxide having a thickness of at least 10 Å, more preferably 10–300 Å, most preferably 20–100 Å. Preferably, the temperature of RTO is at least 800° C., more preferably 800–1100° C., most preferably 850–1000° C. Preferably, the time of RTO is from 1 sec. to 10 min., more preferably 10 sec. to 4 minutes, most preferably 30–100 sec. The RTO is carried out under an oxygen containing atmosphere; preferably the oxygen is present as $O_2$, i.e. the atmosphere contains $O_2$. FIG. 4 shows the stack with the sidewall oxide of the present invention.

The RTO produces sidewall oxide in contact with the silicide having a similar thickness to sidewall oxide in contact with the silicon containing layer, as compared to sidewall oxide produced by conventional oxidation. The thickness of the sidewall oxide, as measure from the point it comes into contact with the middle of the silicide layer, is preferably at most 50% thicker, more preferably at most 25% thick, most preferably at most 10% thicker, than the sidewall oxide in contact with the middle of silicon containing layer.

RTA and RTO differ from conventional annealing and oxidizing by the short period of time over which they are carried out: RTA and RTO are carried out for at most 10 minutes, preferably at most 5 minutes. Preferably, the rate of ramping-up the temperature during RTA and RTO is at least 40° C./sec., more preferably 50–250° C./sec. Conventional furnaces typically ramp-up the temperature at a rate of 2–3° C./sec. The temperature of RTA and RTO is the temperature at the surface of the object being heated, in this case the surface of the substrate. Preferably, in the present invention, the RTA and RTO are carried out in the same heating system, without exposing the substrate to air, by simply changing the gasses within the heating system and ramping from the RTA temperature to the RTO temperature. This reduces the overall thermal budget, preventing boron penetration through the gate stack and reducing cross diffusion of dopants between N and P type areas, for example when the gate contains both P+ and N+ regions. It also helps prevent delamination between the silicide layer and the silicon containing layer or capping layer of the stack.

Further processing of the semiconductor structure may include forming spacers 34 as shown in FIG. 5, by applying and etching an insulating layer. Other processing may be used to complete formation of semiconductor devices from the semiconductor structure, for example: source/drain regions may be formed in the substrate; additional dielectric layers may be formed on the substrate; and contacts and metallization layers may be formed on these structures. These additional elements may be formed before, during, or after formation of the stack.

The spacers are formed from an insulating material, preferably containing an oxide and/or nitride, more preferably containing silicon oxide or silicon nitride. Even when the spacers contain silicon oxide, they can be distinguished structurally from the sidewall oxide, based on the difference in density between the spacers and the sidewall oxide.

The silicide layer preferably contains silicon and tungsten. More preferably the silicide layer contains tungsten silicide. Excess silicon beyond the stoichiometric $WSi_2$ is desirable to avoid strain and peeling. The capping layer preferably contains an insulating material, preferably containing oxygen and/or nitrogen. More preferably, the capping layer contains silicon oxide, silicon nitride, silicon oxynitride, or multiple layers of one or more of these, and may be prepared by PECVD at low temperature, or by high temperature oxide or silicon nitride deposition.

The substrate may typically be a semiconductor material conventionally known by those of ordinary skill in the art. Examples include silicon, gallium arsenide, germanium, gallium nitride, aluminum phosphide, and alloys such as $Si_{1-x}Ge_x$ and $Al_xGa_{1-x}As$, where 0 x 1. Many others are known, such as those listed in Semiconductor Device Fundamentals, on page 4, Table 1.1 (Robert F. Pierret, Addison-Wesley, 1996). Preferably, the semiconductor substrate is silicon, which may be doped or undoped.

The semiconductor structure of the present invention may be incorporated into a variety of semiconductor devices, for example integrated circuits (e.g., memory cells such as SRAM, DRAM, EPROM, and EEPROM); programmable logic devices; data communications devices; and clock generation devices. Furthermore, any of these semiconductor devices may itself be incorporated into a multitude of electronic devices, for example computers, automobiles, airplanes, and satellites.

The individual semiconductor processing steps used in accordance with the present invention are well known to those of ordinary skill in the art, and are also described in numerous publications and treatises, including: *Encyclopedia of Chemical Technology, Volume* 14 (Kirk-Othmer, 1995, pp. 677–709); *Semiconductor Device Fundamentals* by Robert F. Pierret (Addison-Wesley, 1996); *Silicon Processing for the VLSI Era* by Wolf (Lattice Press, 1986, 1990, 1995, vols 1–3, respectively); and *Microchip Fabrication: A Practical Guide to Semiconductor Processing* by Peter Van Zant (4$^{th}$ Edition, McGraw-Hill, 2000).

EXAMPLES

Identical poly/tungsten silicide stacks, have a silicon nitride capping layer, were subject to oxidation, either wet oxidation, dry oxidation, or RTO. The conditions used are detailed in the table below.

| Sample | Starting Temp. | RAMP | HOLD | RAMP | HOLD |
|---|---|---|---|---|---|
| Dry Oxidation | 600° C. | 35 min. up to 900° C. (200 sccm $O_2$; 9.8 slm $N_2$) | 35 min. up to 900° C. (200 sccm $O_2$; 9.8 slm $N_2$) | | |

-continued

| Sample | Starting Temp. | RAMP | HOLD | RAMP | HOLD |
|---|---|---|---|---|---|
| Wet Oxidation | 750° C. | 15 min. up to 790° C. (7 slm $N_2$) | 12 min. 30 sec. at 790° C. (10 slm $N_2$ 4 slm $O_2$; 1 min. 30 sec. $H_2$ at 2 slm followd by 11 min. $H_2$ at 5 slm) | | |
| RTO | Room Temp. (5 slm $N_2$) | 50° C./sec. up to 800° C. (3 slm Ar) | 10 sec. at 800° C. (3 slm Ar) | 50° C./sec. up to 975° C. (3 slm $O_2$) | 75 sec. at 975° C. (3 slm $O_2$) |

The thickness of sidewall oxide in contact with the poly was 45 Å for each sample. In contrast, the thickness of sidewall oxide in contact with the tungsten silicide was >100 Å, >250 Å, and about 50 Å, for the dry oxidation, to wet oxidation and RTO, respectively.

Obviously, numerous modifications and variations of the present invention are possible in light of the above teachings. It is therefore to be understood that within the scope of the appended claims, the invention may be practiced otherwise than as specifically described herein.

The invention claimed is:

1. A method of forming a semiconductor structure, comprising:
    forming sidewall oxide on a stack, by rapid thermal oxidation;
    wherein the stack is on a substrate,
    the stack comprises
        (i) a first layer comprising silicon,
        (ii) a second layer, comprising silicon and tungsten, on the first layer, and
        (iii) a capping layer, on the second layer; and
    the sidewall oxide in contact with the second layer is at most 50% thicker than the sidewall oxide in contact with the first layer.

2. The method of claim 1, wherein the second layer comprises a hexagonal phase.

3. The method of claim 1, wherein the sidewall oxide in contact with the second layer is at most 25% thicker than the sidewall oxide in contact with the first layer.

4. The method of claim 3, wherein the sidewall oxide in contact with the second layer is at most 10% thicker than the sidewall oxide in contact with the first layer.

5. The method of claim 1, wherein the second layer comprises tungsten silicide.

6. The method of claim 1, wherein the capping layer comprises silicon and nitrogen.

7. The method of claim 1, wherein the capping layer comprises silicon, nitrogen and oxygen.

8. The method of claim 1, wherein rapid thermal oxidation is carried out at a temperature of 800–1100° C., for a time of 30–100 sec.

9. The method of claim 1, further comprising, prior to the forming, annealing the stack, by rapid thermal annealing.

10. The method of claim 9, wherein rapid thermal annealing is carried out at a temperature of 720–1050° C.

11. The method of claim 9, wherein:
    the sidewall oxide in contact with the second layer is at most 10% thicker than the sidewall oxide in contact with the first layer,
    the first layer comprises poly,
    the second layer comprises tungsten silicide, and
    the capping layer comprises silicon nitride.

12. The method of claim 1, wherein the stack further comprises (iv) a barrier layer comprising tungsten and nitrogen, on the first layer.

13. A method of making a semiconductor device comprising:
    forming a semiconductor structure by the method of claim 1; and
    forming a semiconductor device from the structure.

14. A method of making an electronic device comprising:
    making a semiconductor device by the method of claim 13; and
    forming an electronic device, which comprises the semiconductor device.

15. A method of forming a semiconductor structure, comprising:
    forming sidewall oxide on a stack, by rapid thermal oxidation; and
    prior to the forming, annealing the stack, by rapid thermal annealing;
    wherein the stack is on a substrate,
    the stack comprises
        (i) a first layer comprising silicon,
        (ii) a second layer, comprising silicon and tungsten, on the first layer, and
        (iii) a capping layer, comprising silicon nitride, oxide or oxynitride, on the second layer, and
    the second layer comprises a hexagonal phase.

16. The method of claim 15, wherein the second layer comprises tungsten silicide.

17. A method of making a semiconductor device comprising:
    forming a semiconductor structure by the method of claim 15; and
    making a semiconductor device from the structure.

18. A method of making an electronic device comprising:
    making a semiconductor device by the method of claim 17; and
    forming an electronic device, which comprises the semiconductor device.

* * * * *